US012628714B2

(12) United States Patent　　　　　(10) Patent No.:　US 12,628,714 B2
Ikeda et al.　　　　　　　　　　　　(45) Date of Patent:　　May 12, 2026

(54) SEMICONDUCTOR DEVICE

(71) Applicant: Mitsubishi Electric Corporation, Tokyo (JP)

(72) Inventors: Naoki Ikeda, Tokyo (JP); Kazuki Koda, Tokyo (JP); Shuhei Yokoyama, Tokyo (JP); Shogo Shibata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 700 days.

(21) Appl. No.: 18/047,079

(22) Filed: Oct. 17, 2022

(65) Prior Publication Data

US 2023/0215787 A1　　Jul. 6, 2023

(30) Foreign Application Priority Data

Jan. 6, 2022　(JP) ................................. 2022-001065

(51) Int. Cl.
H10W 90/00　　　(2026.01)
H10W 74/10　　　(2026.01)

(52) U.S. Cl.
CPC ........ H10W 90/811 (2026.01); H10W 74/111 (2026.01); H10W 90/753 (2026.01); H10W 90/756 (2026.01)

(58) Field of Classification Search
CPC ........ H10D 84/40–409; H10D 84/0123–0126; H10D 84/0107; H10D 84/101; H10D 84/161; H01L 25/07–074; H01L 21/565–566; H01L 23/562–576; H01L 23/49562; H01L 23/49575; H01L 23/31–3107; H01L 2924/181–1815; H01L 2224/48245–4826; H01L 2224/48151–48265;

(Continued)

(56) References Cited

U.S. PATENT DOCUMENTS

2014/0299979 A1*　10/2014　Danno .............. H01L 23/49541
　　　　　　　　　　　　　　　　　438/107
2015/0155228 A1　　6/2015　Ikeda et al.

(Continued)

FOREIGN PATENT DOCUMENTS

JP　　2015-106685 A　　6/2015
WO　　2018/096573 A1　　5/2018

(Continued)

OTHER PUBLICATIONS

"IGBT Freewheeling Diodes" from Danfoss Editron. Obtained 2025.*

(Continued)

*Primary Examiner* — Julio J Maldonado
*Assistant Examiner* — Eric Manuel Mulero Flores
(74) *Attorney, Agent, or Firm* — Studebaker Brackett PLLC

(57)　　　　　　ABSTRACT

A semiconductor device includes: a rectangular RC-IGBT; an IC chip electrically connected to the RC-IGBT; a plurality of control terminals electrically connected to the IC chip; a plurality of power terminals electrically connected to the RC-IGBT; and a rectangular sealing resin covering the RC-IGBT and the IC chip. The RC-IGBT has an aspect ratio of 1.62 or more, the sealing resin has a lengthwise length of 44 mm or smaller, and the semiconductor device has a rated current of 25 A or more.

7 Claims, 5 Drawing Sheets

(58) Field of Classification Search
CPC ......................... H01L 2224/484–48499; H01L
2224/481–48265; H01L 2225/065–06596;
H01L 25/065–0657; H01L 25/18; H01L
2224/4807; H01L 2224/48476; H01L
2224/85; H01L 2224/85047; H01L
2224/85186; H01L 2224/85201; H01L
2224/85203; H01L 2224/8538; H01L
2224/85385; H02M 1/0003–44; H02M
7/003; H02M 7/155–17; H02M 5/005–48;
H10W 90/753; H10W 90/756; H10W
90/811
See application file for complete search history.

(56) References Cited

U.S. PATENT DOCUMENTS

| | | | | |
|---|---|---|---|---|
| 2016/0300778 A1* | 10/2016 | Nishijima | ............... | H01L 23/24 |
| 2017/0033710 A1* | 2/2017 | Muto | ................... | H02M 7/003 |
| 2017/0237362 A1* | 8/2017 | Sasaki | ................... | H02M 7/003 |
| | | | | 363/98 |
| 2018/0204778 A1* | 7/2018 | Hasegawa | ............... | H01L 25/18 |
| 2019/0006270 A1* | 1/2019 | Niu | ................... | H01L 23/49562 |
| 2019/0057928 A1* | 2/2019 | Kawashima | ........... | H01L 23/42 |
| 2020/0194353 A1 | 6/2020 | Yokoyama et al. | | |
| 2020/0294925 A1* | 9/2020 | Yamada | ................. | H01L 24/06 |
| 2020/0395343 A1 | 12/2020 | Kakefu et al. | | |

FOREIGN PATENT DOCUMENTS

| | | |
|---|---|---|
| WO | 2019/216161 A1 | 11/2019 |
| WO | 2020/059285 A1 | 3/2020 |

OTHER PUBLICATIONS

"IGBT Freewheeling Diodes" from Danfoss Editron. Obtained 2025 (Year: 2025).*
"Notice of Reasons for Refusal" Office Action issued in JP 2022-001065; mailed by the Japanese Patent Office on Oct. 29, 2024.

* cited by examiner

F I G. 1
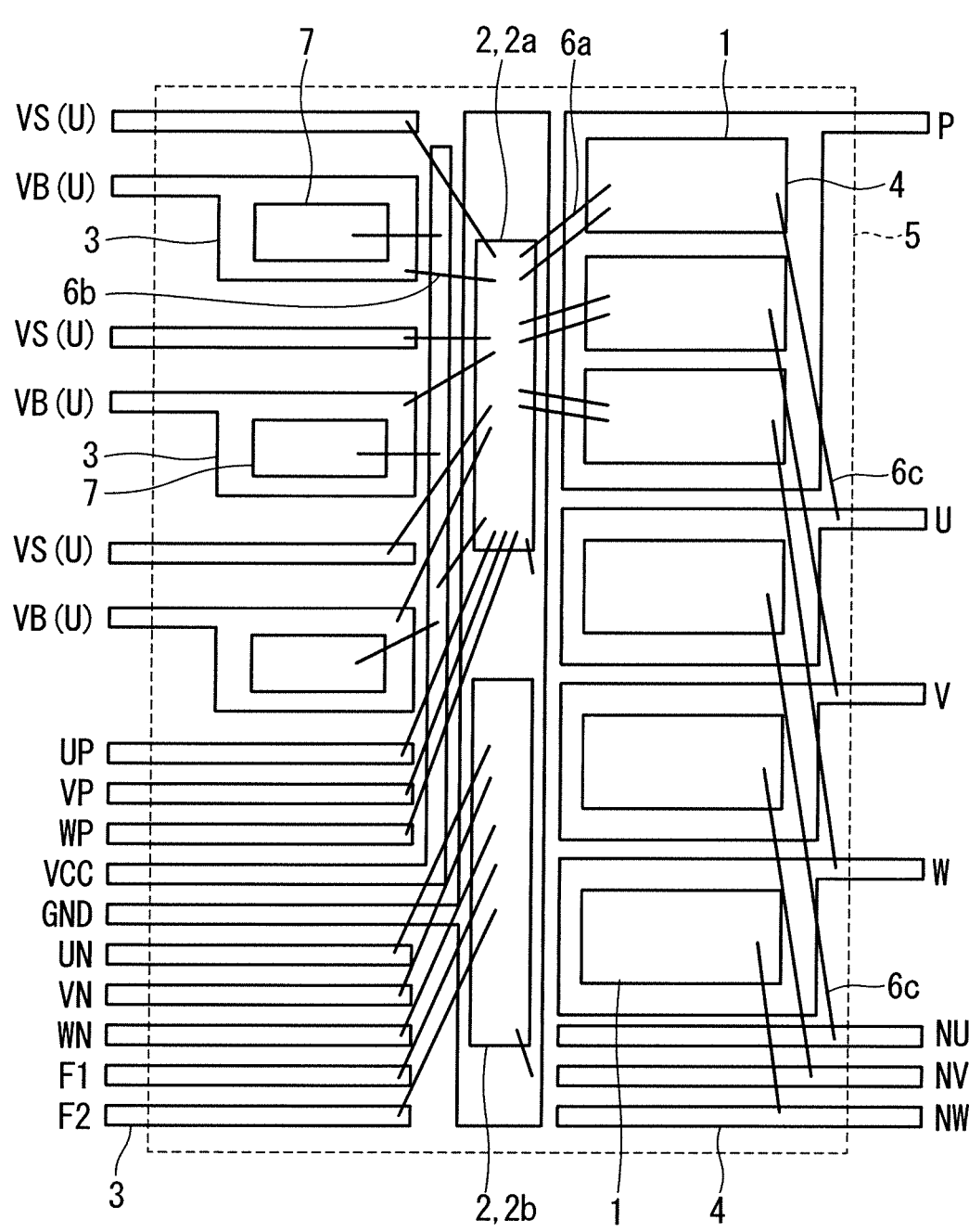

F I G. 2
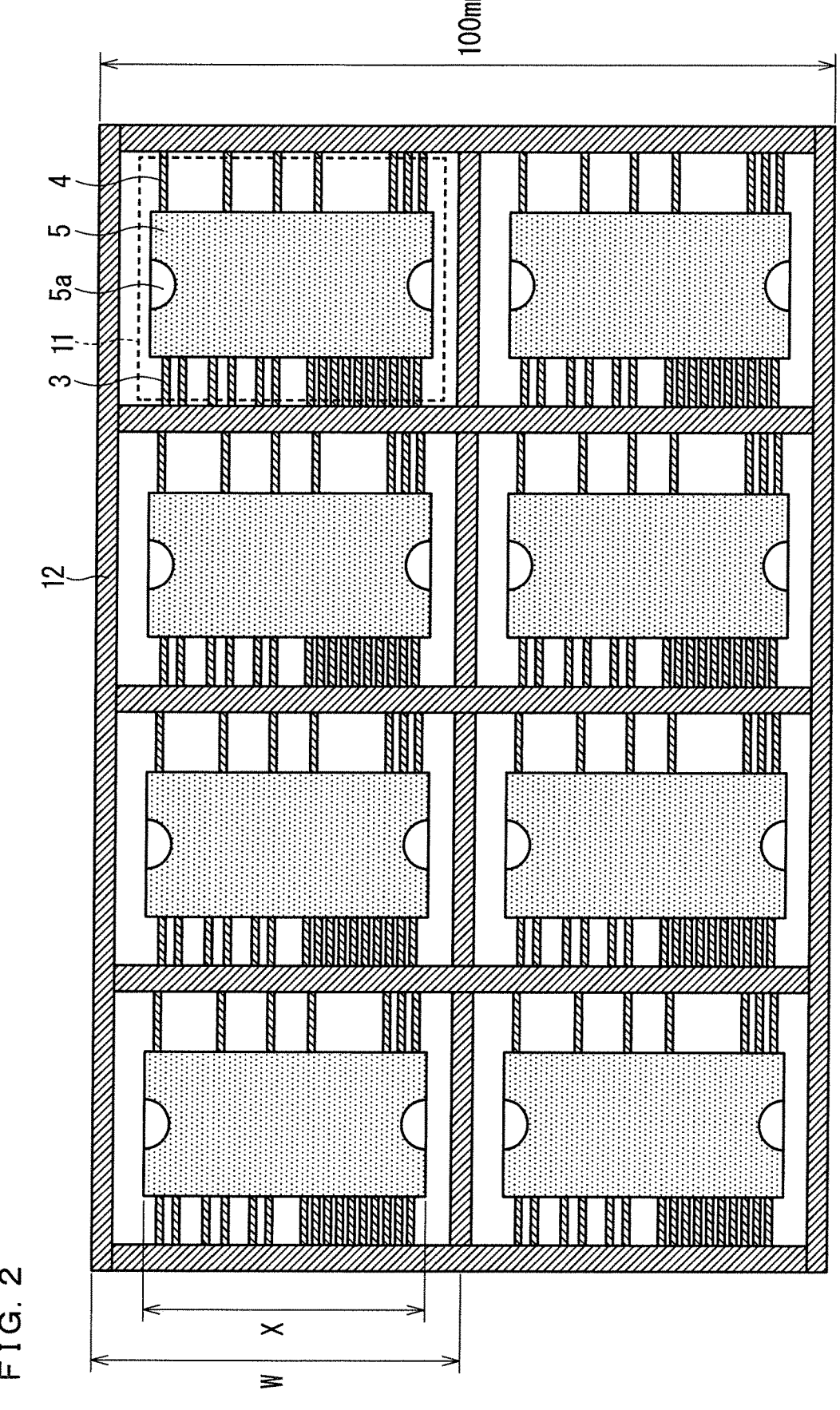

FIG. 4

F I G. 5
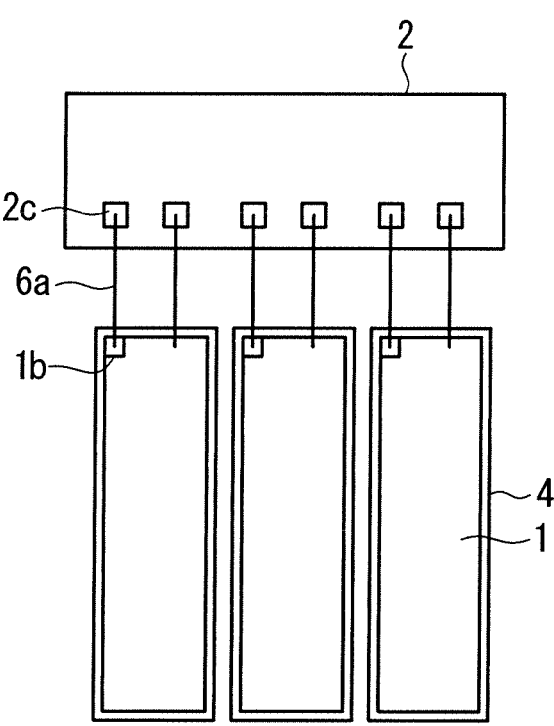

SEMICONDUCTOR DEVICE

BACKGROUND OF THE INVENTION

Field of the Invention

The present disclosure relates to a semiconductor device.

Description of the Background Art

A power module that is a semiconductor device for electric power is used in various apparatuses, and manufacturers have proposed various power modules. In particular, as a power module for consumer electronics such as home electric appliances, a dual inline package (DIP) transfer-molded power module including a terminal formed of a lead frame has been proposed (for example, Japanese Patent Application Laid-Open No. 2015-106685).

In recent years, from the viewpoint of economic efficiency, a current and a breakdown voltage of a small power module are becoming higher and higher. For such a higher current and a higher breakdown voltage, the size of a power chip mounted in a power module needs to be increased. However, increasing the size of a power chip results in reduction of the number of power modules that can be produced from one lead frame, which causes a problem of reduced productivity.

SUMMARY

The present disclosure has been made in view of the above-described problem, and an object of the present disclosure is to provide a technique that enables production of the appropriate number of semiconductor devices from one lead frame.

A semiconductor device according to the present disclosure includes: a rectangular RC-IGBT; an IC chip electrically connected to the RC-IGBT; a plurality of control terminals electrically connected to the IC chip; a plurality of power terminals electrically connected to the RC-IGBT; and a rectangular sealing resin covering the RC-IGBT and the IC chip, wherein the plurality of control terminals protrudes from one longer side of the sealing resin, the plurality of power terminals protrudes from the other longer side of the sealing resin, the RC-IGBT has an aspect ratio of 1.62 or more, the sealing resin has a lengthwise length of 44 mm or smaller, and the semiconductor device has a rated current of 25 A or more.

The appropriate number of semiconductor devices can be produced from one lead frame.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a plan view schematically illustrating a configuration of a semiconductor device according to a first preferred embodiment;

FIG. 2 is a plan view illustrating a part of manufacturing processes of the semiconductor device according to the first preferred embodiment;

FIG. 4 is a view illustrating a relationship between an aspect ratio of the RC-IGBT and a length X of a sealing resin according to the first preferred embodiment; and FIG. 5 is a plan view schematically illustrating an RC-IGBT and an IC chip according to a second preferred embodiment.

DESCRIPTION OF THE PREFERRED EMBODIMENTS

Figure 3:
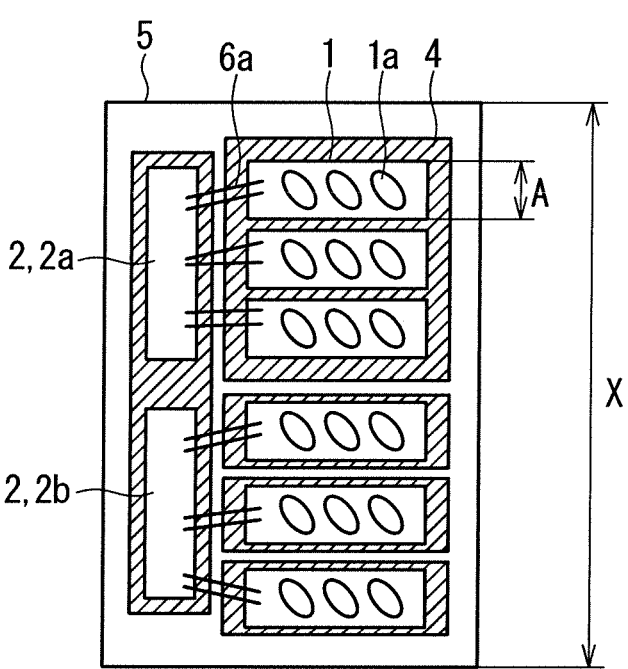
FIG. 3 is a plan view schematically illustrating an RC-IGBT and an IC chip according to the first preferred embodiment.

Hereinafter, preferred embodiments will be described with reference to the accompanying drawings. Features described in the following embodiments are examples, and all of the features are not necessarily essential. In the following description, similar components in a plurality of preferred embodiments are denoted by the same or similar reference signs, and different components will be mainly described. Further, in the following description, specific positions and directions such as "upper", "lower", "left", "right", "front", and "back" are not necessarily required to be equal to actual positions and directions in practice.

First Preferred Embodiment

FIG. 1 is a plan view schematically illustrating a configuration of a semiconductor device 11 according to a first preferred embodiment. Below, the semiconductor device 11 according to the first preferred embodiment will be described as a power module.

The semiconductor device 11 in FIG. 1 includes a reverse conductive IGBT (RC-IGBT) 1, an integrated circuit (IC) chip 2, a plurality of control terminals 3, a plurality of power terminals 4, a sealing resin 5, a plurality of wires 6a, 6b, and 6c, and a bootstrap diode 7. In FIG. 1, the outer shape of the sealing resin 5 is indicated by a broken line for the sake of convenience.

The RC-IGBT 1 is a rectangular semiconductor switching element including an insulated gate bipolar transistor (IGBT) and a freewheeling diode that are provided in one semiconductor substrate. The size of the RC-IGBT 1 is smaller than that in a configuration in which an IGBT and a freewheeling diode are provided in different semiconductor substrates. Thus, using the RC-IGBT 1 as a power chip of the semiconductor device 11 enables reduction of the size of the power chip, thereby reducing the size of the semiconductor device 11.

The IC chip 2 is electrically connected to the RC-IGBT 1 and controls the RC-IGBT 1. For example, the IC chip 2 is electrically connected to the RC-IGBT 1 via the wire 6a, and has a function of driving the RC-IGBT 1, a function of protecting the RC-IGBT 1 under abnormal conditions, and the like, as its functions of controlling the RC-IGBT 1. In the example of FIG. 1, the IC chip 2 includes a high-voltage IC chip 2a electrically connected to three RC-IGBTs 1 via the wires 6a, and a low-voltage IC chip 2b electrically connected to three RC-IGBTs 1 via the wires 6a. Then, the high-voltage IC chip 2a and the low-voltage IC chip 2b are mounted on a frame portion and electrically connected to the frame portion.

The IC chip 2 configured as described above can provide three-phase (U-phase, V-phase, W-phase) AC outputs by using the six RC-IGBTs 1. Note that the IC chip 2 may be a single IC chip in which the high-voltage IC chip 2a and the low-voltage IC chip 2b are integrated, instead of including the high-voltage IC chip 2a and the low-voltage IC chip 2b. Further, the number of the RC-IGBTs 1 is not limited to six.

The plurality of control terminals 3 is electrically connected to the IC chip 2. For example, the plurality of control terminals 3 may be the frame portion electrically connected to the IC chip 2 via the wires 6b, or may be another frame portion electrically connected to the frame portion (i.e., a die-bonding portion) for mounting the IC chip 2 via the wires 6b. In the example of FIG. 1, the bootstrap diode 7 is mounted on each of some control terminals 3. With this configuration, it is possible to save time and effort to connect the semiconductor device 11 according to the first preferred embodiment and the bootstrap diode at a customer's end or the like.

The plurality of power terminals 4 is electrically connected to the RC-IGBT 1. For example, the plurality of power terminals 4 may be a frame portion electrically connected to the RC-IGBT 1 via the wires 6c, or may be another frame portion electrically connected to the frame portion (i.e., a die-bonding portion) for mounting the RC-IGBT 1 via the wires 6c. The power terminal 4 may be integrated with the die-bonding portion on which the RC-IGBT 1 is mounted, may be a conductive member ultrasonically bonded to the die-bonding portion, or may be a conductive member electrically connected to the die-bonding portion via a wire, solder, or the like.

In illustration in FIG. 1, the number of the wires 6c connected to one RC-IGBT 1 is one for the sake of convenience, but the number of the wires 6c connected to one RC-IGBT 1 may be two or more. Below, an example in which the number of the wires 6c connected to one RC-IGBT 1 is two or more and the wires 6c connect the RC-IGBT 1 and at least one of the plurality of power terminals 4 will be described.

The sealing resin 5 covers the RC-IGBT 1, the IC chip 2, the plurality of wires 6a, 6b, and 6c, the bootstrap diode 7, and the like. The sealing resin 5 has an insulating property, and insulates the RC-IGBT 1, the IC chip 2, the plurality of wires 6a, 6b, and 6c, the bootstrap diode 7, and the like, from each other, and protects them. Below, in the first preferred embodiment, the sealing resin 5 will be described as having a rectangular shape, and the semiconductor device 11 will be described as having a shape corresponding to the shape of the sealing resin 5.

As illustrated in FIG. 1, the plurality of control terminals 3 protrudes from one longer side (the left longer side in FIG. 1) of the sealing resin 5, and the plurality of power terminals 4 protrudes from the other longer side (the right longer side in FIG. 1) of the sealing resin 5. In this configuration, the plurality of control terminals 3 is provided on one side of the sealing resin 5, and the plurality of power terminals 4 is provided on the other side. This makes it easy to lay wires in a printed circuit board on which the semiconductor device 11 is mounted. Consequently, reduction of parasitic inductance and reduction of noises in a large current path can be expected.

In the example of FIG. 1, the plurality of control terminals 3 is arranged on the opposite side of the RC-IGBT 1 with respect to the IC chip 2 in plan view. Further, the plurality of power terminals 4 is arranged on the same side as the RC-IGBT 1 with respect to the IC chip 2 in plan view. Because of this configuration, the plurality of control terminals 3 can be placed as close as possible to the IC chip 2, and the plurality of power terminals 4 can be placed as close as possible to the RC-IGBT 1. Thus, the size of the semiconductor device 11 can be reduced, and further, a subsidiary effect of adjusting the inductance of each phase to stabilize the electrical characteristics can be expected.

FIG. 2 is a plan view illustrating a part of manufacturing processes of the semiconductor device 11 according to the first preferred embodiment. The frame portion on which the IC chip 2 and the like are mounted, the plurality of control terminals 3, and the plurality of power terminals 4 are included in a lead frame 12 that is a metal plate having a pattern formed therein.

The lead frame 12 is in a state in which the respective tip ends of the plurality of control terminals 3, as well as the respective tip ends of the power terminals 4, are connected to each other as illustrated in FIG. 2, and then the lead frame 12 is cut so that the tip ends are separated away from each other. Thereafter, the plurality of control terminals 3 and the plurality of power terminals 4 are bent, whereby the semiconductor device 11 is completed. In the example of FIG. 2, the widthwise direction of the lead frame 12 corresponds to the lengthwise direction of the semiconductor device 11, and eight semiconductor devices 11 can be produced from one lead frame 12. The sealing resin 5 may be provided with a screw hole 5a as illustrated in FIG. 2.

Here, in the semiconductor device 11 according to the first preferred embodiment, a ratio of the longer side to the shorter side of the RC-IGBT 1, that is, an aspect ratio, is 1.62 or more, the sealing resin 5 has a lengthwise length of 44 mm or less, and the semiconductor device 11 has a rated current of 25 A or more.

FIG. 3 is a plan view schematically illustrating the RC-IGBT 1 and the IC chip 2 according to the first preferred embodiment. In FIG. 3, a part of the power terminals 4, the control terminals 3, and the like are omitted.

FIG. 3 illustrates a lengthwise length X of the sealing resin 5 and a widthwise length A of the RC-IGBT 1. For the lengthwise length X of the sealing resin 5 in FIG. 3, the widthwise length A of the RC-IGBT 1, and a length B required other than the length A, such as a distance between the RC-IGBTs 1, the following expression (1) holds.

$$X = 6 \times A + B \tag{1}$$

Here, optimization of the length X that is the outer dimension of the semiconductor device 11 will be considered. The allowable widthwise dimension of the lead frame 12 in a manufacturing apparatus that conveys the lead frame 12 in FIG. 2 is typically 100 mm. As the number of rows of the semiconductor devices 11 arranged along the lengthwise direction thereof, which is the widthwise direction of the lead frame 12 increases, the number of semiconductor devices 11 that can be produced from one lead frame 12 increases, thereby improving the productivity of the semiconductor devices 11. However, in such a case, fillability of a resin in a molding process for forming the sealing resin 5 is poor.

Thus, the number of rows of the semiconductor devices 11 arranged along the lengthwise direction thereof, which is the widthwise direction of the lead frame 12 is set to two as in FIG. 2. In this case, for the widthwise length W of the lead frame 12 for one semiconductor device 11, a length B' required other than the length W, such as the length of the outer frame of the lead frame 12, and 100 mm, which is the size of the lead frame 12, the following expression (2) needs to hold.

$$2 \times W + B' \leq 100 \tag{2}$$

When 10 mm, which is the length between the outer frame of the lead frame 12 and a mold for molding a resin, is substituted for the length B' in the expression (2), the following expression (3) holds for the widthwise length W of the lead frame 12 for one semiconductor device 11.

$$W \leq 45 \tag{3}$$

For the widthwise length W of the lead frame 12 for one semiconductor device 11, the lengthwise length X of one semiconductor device 11, and a clearance S therebetween, the following expression (4) holds.

$$X+S=W \qquad (4)$$

When 1 mm is substituted for the clearance S in the expression (4), the following expression (5) holds for the length X of one semiconductor device 11, that is, the length X of the sealing resin 5.

$$X \leq 44 \qquad (5)$$

Figure 4:
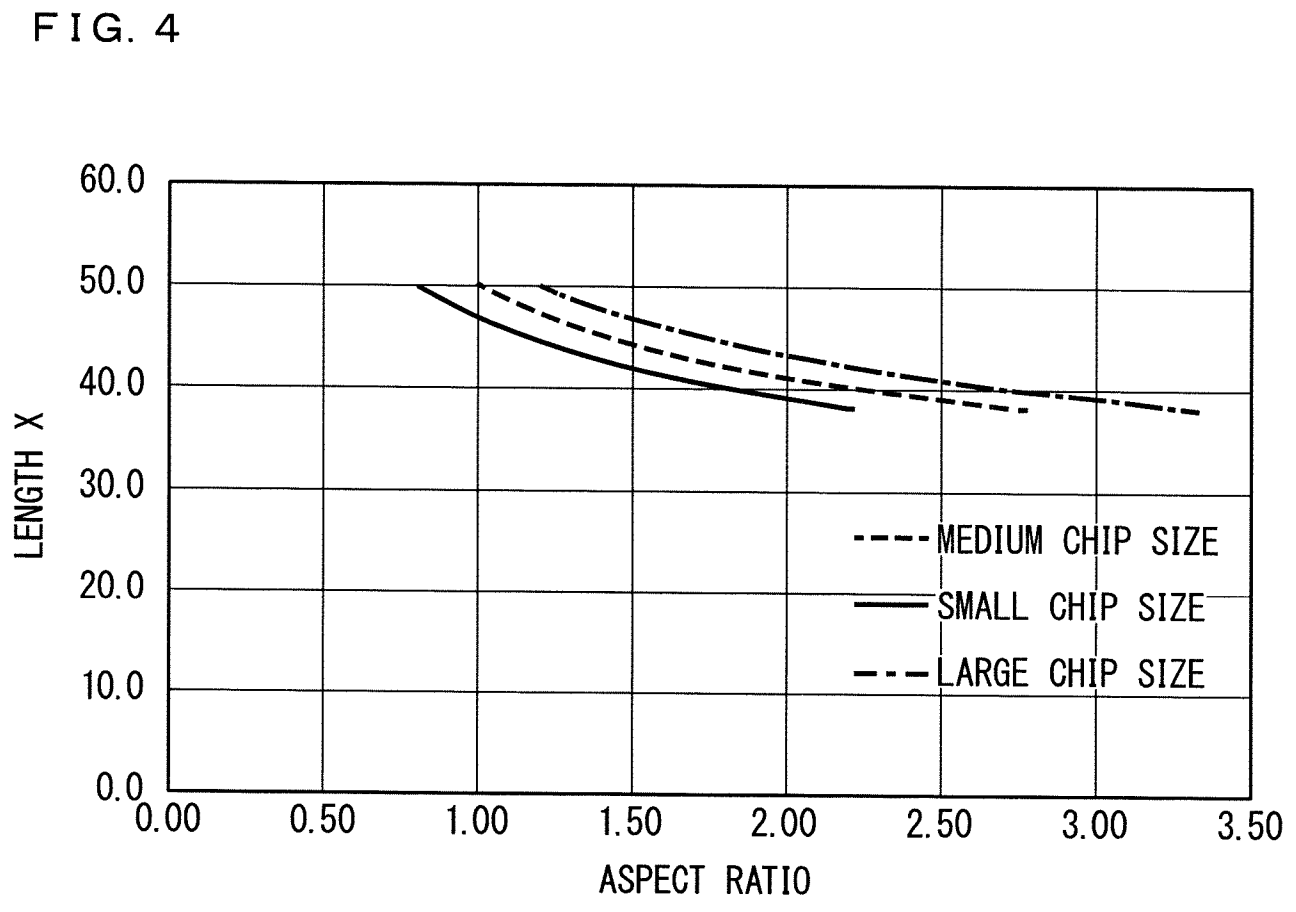

In the expression (1), 20 mm, which is a sum of insulation distances at three locations between the four power terminals 4, the length of a space and an electrode for forming a solder fillet under the RC-IGBT 1, and the dimension of the screw hole 5a in FIG. 2, is substituted for the length B. FIG. 4 is a view illustrating a relationship between the aspect ratio of the RC-IGBT 1 and the length X of the sealing resin 5 in this case. Note that, in a case in which the lengthwise length of the RC-IGBT 1 is constant, as the widthwise length A of the RC-IGBT 1 decreases, the aspect ratio of the RC-IGBT 1 increases.

In FIG. 4, in a case in which the chip size is large, the aspect ratio of the RC-IGBT 1 corresponding to the length X of 44 mm of the sealing resin 5 is 1.62. Thus, it is preferable that the length W of the lead frame 12 for one semiconductor device 11 is 45 mm or less, the length X of the sealing resin 5 is 44 mm or less, and the aspect ratio of the RC-IGBT 1 is 1.62 or more. With this configuration, the number of semiconductor devices 11 that can be produced from one lead frame 12 can be increased as much as possible, while considering the allowance of the manufacturing apparatus that conveys the lead frame 12. As a result, it is possible to improve the productivity while reducing expenditure for equipment.

FIG. 3 illustrates the wires 6a connecting the RC-IGBTs 1 and the IC chip 2. As the wires 6a, a thin wire made of metal such as aluminum or copper is used. The two or more wires 6a are connected to a portion of each RC-IGBT 1 on the IC chip 2 side while being arranged along the widthwise direction of each RC-IGBT 1.

With the configuration in which two or more connection points between the RC-IGBT 1 and the two or more wires 6a are arranged along the widthwise direction of the RC-IGBT 1 as illustrated in FIG. 3, it is possible to make full use of the effective area of the RC-IGBT 1 having a large aspect ratio. Note that, the two or more connection points being arranged along the widthwise direction of the RC-IGBT 1 means that an angle formed between the arrangement direction of the two or more connection points and the widthwise direction of the RC-IGBT 1 is 5° or less, for example.

Further, FIG. 3 illustrates connection points 1a between the wires 6c connected to the power terminals 4 in FIG. 1 and the RC-IGBTs 1. As the wires 6c, a thick wire made of metal is used. The number of the wires 6c connected to the RC-IGBT 1 is preferably two or more, and more preferably three or more as illustrated in FIG. 3.

The two or more wires 6c are connected to a portion of each RC-IGBT 1 spaced away from the IC chip 2 while being arranged along the lengthwise direction of each RC-IGBT 1. As a result, as illustrated in FIG. 3, two or more connection points 1a between the RC-IGBT 1 and the two or more wires 6c are arranged along the lengthwise direction of the RC-IGBT 1. Note that, the two or more connection points 1a being arranged along the lengthwise direction of the RC-IGBT 1 means that an angle formed between the arrangement direction of the two or more connection points 1a and the lengthwise direction of the RC-IGBT 1 is 5° or less, for example. Meanwhile, the two or more connection points 1a between the RC-IGBT 1 and the two or more wires 6c are not arranged along the widthwise direction of the RC-IGBT 1. With this configuration, the length W (sometimes referred to as a one-pitch width) of the lead frame 12 for one semiconductor device 11 can be set to 45 mm or less.

Further, the connection point 1a has a shape elongated along one direction in plan view. In the example of FIG. 3, the connection point 1a has an elliptical shape elongated along the lengthwise direction as one direction in plan view. An angle formed between the lengthwise direction of the connection point 1a and the lengthwise direction of the RC-IGBT 1 is 40° or more and 50° or less, and preferably 45°. With this configuration, it is possible to ensure an insulation distance between the wires 6c while shortening the widthwise length A of the RC-IGBT 1. This is particularly effective in a configuration in which one semiconductor device 11 has a relatively small length X (that is, the length X of the sealing resin 5) of 44 mm or less and the RC-IGBT 1 having an aspect ratio of 1.62 or more is mounted.

Second Preferred Embodiment

FIG. 5 is a plan view schematically illustrating the RC-IGBT 1 and the IC chip 2 according to a second preferred embodiment. Below, among components according to the second preferred embodiment, components that are the same as or similar to the above-described components will be denoted by the same or similar reference signs, and different components will be mainly described.

In the second preferred embodiment, the IC chip 2 has a rectangular shape, and the widthwise length of the RC-IGBT 1 is one-third or less of the lengthwise length of the IC chip 2. Then, the IC chip 2 includes a bonding pad 2c on the RC-IGBT 1 side, and the RC-IGBT 1 includes a gate pad 1b on the IC chip 2 side. The wire 6a connects the bonding pad 2c and the gate pad 1b. Note that, in order for the six RC-IGBTs 1 to be driven by the high-voltage IC chip 2a and the low-voltage IC chip 2b as in the first preferred embodiment, it suffices that two sets each including the configuration of FIG. 5 are provided.

In the semiconductor device subjected to transfer molding, the wire 6a is likely to be swept away during resin injection in the molding process if the wire 6a is long. This may probably cause the wire 6a to be detached, to cause a short-circuit failure. In contrast thereto, with the above-described configuration of the second preferred embodiment, the distance between the RC-IGBT 1 and the IC chip 2 can be shortened, which allows the wire 6a to be shortened. Hence, a short-circuit failure can be prevented.

Modification

In the first and second preferred embodiments, a material of the RC-IGBT 1 may be normal silicon or a wide band-gap semiconductor. A wide band-gap semiconductor includes, for example, silicon carbide (SiC), gallium nitride (GaN), diamond, and the like. Because of a high breakdown voltage and low loss of the RC-IGBT 1 including a wide band-gap semiconductor, the chip size of the RC-IGBT 1 can be reduced, so that the semiconductor device 11 can be downsized. In addition, the heat resistance of the chip of the RC-IGBT 1 can be enhanced, and hence, downsizing of a fin necessary for heat dissipation of the semiconductor device 11 can also be expected.

Moreover, the preferred embodiments and the modifications can be freely combined, or each of the preferred embodiments and the modifications can be appropriately modified or omitted.

While the disclosure has been shown and described in detail, the foregoing description is in all aspects illustrative and not restrictive. It is therefore understood that numerous modifications and variations can be devised.

What is claimed is:

1. A semiconductor device comprising:
a rectangular RC-IGBT;
an IC chip electrically connected to the RC-IGBT;
a plurality of control terminals electrically connected to the IC chip;
a plurality of power terminals electrically connected to the RC-IGBT;
a rectangular sealing resin covering the RC-IGBT and the IC chip; and
two or more wires connecting the RC-IGBT and at least one of the plurality of power terminals, wherein
the plurality of control terminals protrudes from one longer side of the sealing resin,
the plurality of power terminals protrudes from the other longer side of the sealing resin,
the RC-IGBT has an aspect ratio of 1.62 or more,
the sealing resin has a lengthwise length of 44 mm or smaller,
the semiconductor device has a rated current of 25 A or more,
a widthwise length of the RC-IGBT is one-third or less of a lengthwise length of the IC chip,
each of two or more connection points between the RC-IGBT and the two or more wires has a shape elongated along one direction in plan view, and
an angle formed between the one direction and a lengthwise direction of the RC-IGBT is 40° or more and 50° or less.

2. The semiconductor device according to claim 1, wherein
the two or more connection points between the RC-IGBT and the two or more wires are arranged along a lengthwise direction of the RC-IGBT.

3. The semiconductor device according to claim 1, wherein
the IC chip has a rectangular shape, the IC chip includes a bonding pad on the RC-IGBT side,
the RC-IGBT includes a gate pad on the IC chip side, and
the semiconductor device further comprises a wire that connects the bonding pad and the gate pad.

4. The semiconductor device according to claim 1, wherein a material of the RC-IGBT includes a wide band-gap semiconductor.

5. A semiconductor device comprising:
a rectangular RC-IGBT;
an IC chip electrically connected to the RC-IGBT;
a plurality of control terminals electrically connected to the IC chip;
a plurality of power terminals electrically connected to the RC-IGBT; and
a rectangular sealing resin covering the RC-IGBT and the IC chip, wherein
the plurality of control terminals protrudes from one longer side of the sealing resin,
the plurality of power terminals protrudes from the other longer side of the sealing resin,
the RC-IGBT has an aspect ratio of 1.62 or more,
the sealing resin has a lengthwise length of 44 mm or smaller,
the semiconductor device has a rated current of 25 A or more,
the IC chip has a rectangular shape,
a widthwise length of the RC-IGBT is one-third or less of a lengthwise length of the IC chip,
the IC chip includes a bonding pad on the RC-IGBT side,
the RC-IGBT includes a gate pad on the IC chip side, and
the semiconductor device further comprises a wire that connects the bonding pad and the gate pad.

6. The semiconductor device according to claim 5, further comprising two or more wires connecting the RC-IGBT and at least one of the plurality of power terminals, wherein
two or more connection points between the RC-IGBT and the two or more wires are arranged along a lengthwise direction of the RC-IGBT.

7. The semiconductor device according to claim 5, wherein a material of the RC-IGBT includes a wide band-gap semiconductor.

* * * * *